US009084070B2

(12) United States Patent
Crockett et al.

(10) Patent No.: US 9,084,070 B2
(45) Date of Patent: Jul. 14, 2015

(54) SYSTEM AND METHOD FOR AUTOMATIC SELECTION OF AUDIO CONFIGURATION SETTINGS

(75) Inventors: Brett G. Crockett, Brisbane, CA (US); Matthew S. Chang, Santa Clara, CA (US); Alan J. Seefeldt, San Francisco, CA (US); Mohammad N. Ahmad, Castro Valley, CA (US); Bruce R. Jackson, Marina Del Rey, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 691 days.

(21) Appl. No.: 13/379,826

(22) PCT Filed: Jul. 20, 2010

(86) PCT No.: PCT/US2010/042637
§ 371 (c)(1), (2), (4) Date: Dec. 21, 2011

(87) PCT Pub. No.: WO2011/011438
PCT Pub. Date: Jan. 27, 2011

(65) Prior Publication Data

US 2012/0106747 A1 May 3, 2012

Related U.S. Application Data

(60) Provisional application No. 61/227,528, filed on Jul. 22, 2009.

(51) Int. Cl.
*H03G 3/20* (2006.01)
*H04S 7/00* (2006.01)

(52) U.S. Cl.
CPC ........... *H04S 7/301* (2013.01); *H04R 2205/021* (2013.01); *H04R 2499/13* (2013.01); *H04R 2499/15* (2013.01); *H04S 2420/07* (2013.01)

(58) Field of Classification Search
CPC .................... H04R 2205/021; H04R 2449/13; H04R 2449/15; H04S 2420/07; H04S 7/301
USPC ......................... 381/56, 57, 104–107; 700/94
See application file for complete search history.

(56) References Cited

U.S. PATENT DOCUMENTS 5,805,234 A 9/1998 Matsuura
6,342,925 B1 1/2002 Akhavan
(Continued)

FOREIGN PATENT DOCUMENTS

EP 1482763 12/2004
EP 2009915 12/2008
(Continued)

OTHER PUBLICATIONS

Audyssey, "Dynamic EQ" Audyssey Technology, 2009.

*Primary Examiner* — Vivian Chin
*Assistant Examiner* — Friedrich W Fahnert

(57) ABSTRACT

In one embodiment the present invention includes a circuit for automatically adjusting an output of an audio device. The circuit includes a memory circuit, a detector circuit, a control circuit, and an output circuit. The memory circuit stores configuration information. The detector circuit detects environment information related to an environment in which the apparatus is present. The control circuit selects selected configuration information from the memory circuit according to the environment information detected by the detector circuit. The output circuit receives an input audio signal and the selected configuration information, modifies the input audio signal according to the selected configuration information, and generates an output audio signal corresponding to the input audio signal as modified according to the selected configuration information.

20 Claims, 3 Drawing Sheets

(56) References Cited

U.S. PATENT DOCUMENTS

| | | | | |
|---|---|---|---|---|
| 6,392,716 | B1 | 5/2002 | Nagata | |
| 6,697,687 | B1 * | 2/2004 | Kasahara et al. | 700/94 |
| 7,495,711 | B2 | 2/2009 | Han | |
| 2003/0156075 | A1 | 8/2003 | Motoyama | |
| 2004/0202337 | A1 * | 10/2004 | Jun | 381/107 |
| 2005/0018856 | A1 | 1/2005 | Kim | |
| 2005/0168333 | A1 * | 8/2005 | Cronin | 340/501 |
| 2007/0126503 | A1 * | 6/2007 | Hsieh et al. | 330/129 |
| 2007/0230723 | A1 | 10/2007 | Hobson et al. | |
| 2007/0291959 | A1 * | 12/2007 | Seefeldt | 381/104 |
| 2008/0153537 | A1 * | 6/2008 | Khawand et al. | 455/550.1 |
| 2008/0159561 | A1 * | 7/2008 | Parker et al. | 381/94.5 |
| 2008/0175399 | A1 * | 7/2008 | Kim et al. | 381/57 |
| 2009/0022329 | A1 * | 1/2009 | Mahowald | 381/57 |
| 2010/0074450 | A1 * | 3/2010 | Liao | 381/57 |
| 2010/0111328 | A1 * | 5/2010 | Yu | 381/107 |
| 2012/0039489 | A1 * | 2/2012 | Chen et al. | 381/107 |

FOREIGN PATENT DOCUMENTS

| | | |
|---|---|---|
| GB | 2326547 | 12/2004 |
| JP | 2002-345079 | 11/2002 |
| JP | 2006-101391 | 4/2006 |
| JP | 2007-086412 | 4/2007 |
| JP | 2008-035254 | 2/2008 |
| JP | 2008-299921 | 12/2008 |
| JP | 2008-312096 | 12/2008 |
| KR | 20020040301 | 5/2002 |
| WO | 2009129011 | 10/2009 |
| WO | 2010067250 | 6/2010 |

* cited by examiner

SYSTEM AND METHOD FOR AUTOMATIC SELECTION OF AUDIO CONFIGURATION SETTINGS

CROSS REFERENCE TO RELATED APPLICATIONS

This application claims priority to U.S. Provisional Patent Application No. 61/227,528 filed 22 Jul. 2009, hereby incorporated by reference in its entirety.

BACKGROUND

The present invention relates to automatically configuring an audio device, and in particular, to configuring an audio device according to its environment.

Unless otherwise indicated herein, the approaches described in this section are not prior art to the claims in this application and are not admitted to be prior art by inclusion in this section.

Some existing audio devices include the capability for a user to select various configuration options based on user preferences and other factors. These configuration options often include increasing the volume of some frequency bands and decreasing the volume of other frequency bands. For example, a device may include a "jazz" setting that emphasizes some frequency bands, and de-emphasizes other frequency bands, in accordance with the customary attributes of jazz music or the customary preferences of jazz music listeners. The user may select the configuration by using a dedicated button or toggle switch, or may use a user interface display to make the selection.

Other existing audio devices receive configuration information as part of the audio signal. The devices then adjust their output as appropriate for the specific audio signal. For example, the audio signal may include information indicating that the signal is "jazz"; based on this information, the device emphasizes some frequency bands, and de-emphasizes other frequency bands, in accordance with the customary attributes of jazz music or the customary preferences of jazz music listeners.

Still other existing audio devices perform room equalization. During room equalization, a user installs the audio/visual receiver (AVR) and connects the speakers in their desired reproduction environment. These AVRs include microphones and have internal software that generates test signals that are played back by the AVR (through the attached speakers), and then are picked up and recorded into the internal memory of the AVR. This data is analyzed and the recorded audio data is compared to a desired frequency and phase (and other attributes) response (e.g., a flat spectrum and proper phase and amplitude response for each speaker). This measurement must be done at installation for the unique room environment. If the equipment is moved or any component is altered then the measurement procedure must be repeated. In addition, the built-in measurement and analysis mechanism can be computationally expensive and time consuming (e.g., taking 10s of minutes).

SUMMARY

Embodiments of the present invention improve the ability of audio devices to be configured according to factors other than user preference, for example environmental factors such as the position of the device in relationship to other objects in the environment. This feature is often desirable because it requires no measurement and analysis of the device by the user in the environment especially for situations when the audio device lacks a display or other means for the user to select a placement configuration.

According to an embodiment, an apparatus includes a circuit for automatically adjusting an output of an audio device. The circuit includes a memory circuit, a detector circuit, a control circuit, and an output circuit. The memory circuit stores configuration information. The detector circuit detects information related to the environment in which the apparatus is present. The control circuit selects configuration information from the memory circuit according to the environment information detected by the detector circuit. The output circuit receives an input audio signal and the selected configuration information, modifies the input audio signal according to the selected configuration information, and generates an output audio signal corresponding to the input audio signal as modified according to the selected configuration information.

According to an embodiment, the detector circuit detects an attribute of the environment, and the configuration information is selected based indirectly on the environment.

According to an embodiment, a system automatically adjusts an audio output. The system includes a device that generates the audio output and the circuit described above.

According to an embodiment, a method automatically adjusts an output of an audio device. The method includes storing configuration information. The method further includes detecting environment information related to an environment in which the audio device is present. The method further includes selecting selected configuration information of the configuration information according to the environment information having been detected. The method further includes receiving an input audio signal and the selected configuration information. The method further includes modifying the input audio signal according to the selected configuration information. The method further includes generating an output audio signal corresponding to the input audio signal as modified according to the selected configuration information.

The following detailed description and accompanying drawings provide a further understanding of the nature and advantages of the present invention.

DETAILED DESCRIPTION

Figure 1:
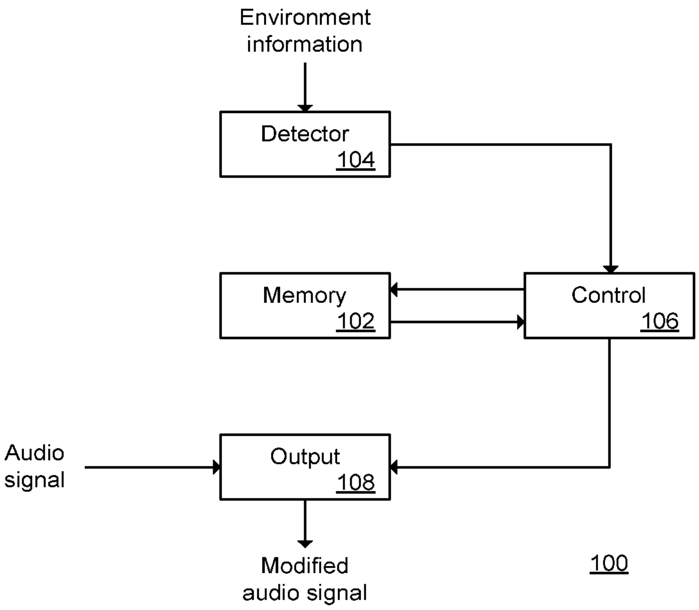
FIG. 1 is a simplified block diagram of a circuit that adjusts the output of an audio device depending upon the environment, according to an embodiment of the present invention.

Described herein are techniques for configuring an electronic device, such as an audio device. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

In the following description, various methods, processes and procedures are detailed. Although particular steps may be described in a certain order, such order is mainly for convenience and clarity. A particular step may be repeated more than once, may occur before or after other steps (even if those steps are otherwise described in another order), and may occur in parallel with other steps. A second step is required to follow a first step only when the first step must be completed before the second step is begun. Such a situation will be specifically pointed out when not clear from the context.

In the following description, the terms "environment" and "environmental information" are used. These terms generally refer to attributes and circumstances that are external to a device. (Various examples of environments and environmental information are discussed below with reference to the various embodiments.) The device is not intended to connect directly with or operate directly with the environment. The device operates within the environment and the environment may indirectly affect the operation of the device. The environment is not an inherent part of or attribute of the device. However, for clarity, it is understood that an environmental attribute may be detected directly by the device's sensor(s).

The terms "environment" and "environmental information" exclude attributes and circumstances that are wholly internal to a device. For example, plug and play functionality is internal. (Plug and play functionality detects that a certain component is part of the device and modifies the operation of the device to account for the presence of that component.) For example, when a subwoofer is plugged into the device, the device generates an output appropriate for the subwoofer. The subwoofer is intended to connect with and to operate with the device; as such, the connection to, and interoperability with, the subwoofer is inherent to the device. As another example, when a certain type of codec is present in the device, the device generates output in a format compatible with that codec. The codec is an inherent part of the device. As a further example, user input is internal. A user using a switch (e.g., dual in-line switch, jumper block, toggle switch, or the like) on (or in) the device to make a configuration selection (or selecting a configuration option from a menu) is using an internal function of the device, and is not providing environmental information (as such) to the device.

As another example, noise cancellation functionality is internal for purposes of this specification. For noise cancelling headphones, for example, the primary function is to monitor and compensate for the environment. Thus, the noise cancellation functionality is so intertwined with the primary function of the noise cancelling headphones that the "environment" (as that term is defined) does not include noise cancellation.

In addition, extra information in a signal already being received by the device is internal. For example, extra data in a music signal indicating the device is to be configured to play the music "loud" irrespective of its sensed environment is using the internal function of the device. Playing the music signal is the main function of the device and is thus an internal attribute of the device. The extra data is a part of and relates directly to the music signal, and is likewise excluded from the environment.

FIG. 1 is a simplified block diagram of a circuit 100 that adjusts the output of an audio device depending upon the environment, according to an embodiment of the present invention. The circuit 100 includes a memory circuit 102, a detector circuit 104, a control circuit 106, and an output circuit 108. The circuit 100 may be implemented with (or as part of) a programmable logic device that is a component of the audio device.

The memory circuit 102 stores configuration information. The configuration information includes a number of sets of data that define how to modify an audio signal. For example, when a television is mounted on a stand, a first set of configuration information is appropriate to use; when the television is mounted on the wall, a second set of configuration information is appropriate to use. More details regarding the configuration information are provided below.

The size of the memory circuit 102 may vary based on the amount and precision of the configuration information. According to an embodiment, the memory circuit 102 is 1024 bytes in size (or more). According to an embodiment, the memory circuit 102 stores at least 2 sets of configuration information; each set includes 20 pieces of information; and each piece of information has a precision of 24 bits. According to an embodiment, the pieces of information are filter coefficients. According to an embodiment, the information is fixed-point information. According to an embodiment, the information is floating-point information.

The detector circuit 104 detects environment information related to the environment. That is, if the detector circuit 104 detects first environment information, then the detector circuit 104 has determined that the circuit 100 (or the audio device that incorporates the circuit 100) is in a first environment. If the detector circuit 104 detects second environment information, then the detector circuit 104 has determined that the circuit 100 is in a second environment. For example (continuing the above example), the detector circuit 104 may detect a closed circuit when the television is mounted on the stand, and may detect an open circuit when the television is not mounted on the stand (which indicates a wall mounting).

The detector circuit 104 may connect to various types of sensors or other components of the device that includes the circuit 100, in order to obtain inputs for detection and evaluation. Although a full description of the various sensors and other components is beyond the scope of the present invention, a number of examples are provided in subsequent sections.

The control circuit 106 selects the appropriate set of configuration information from the memory circuit 102 according to the environment information detected by the detector circuit 104. For example (continuing the above example), the control circuit 106 selects the first set of configuration information when the detector circuit 104 reports that the television is on the stand; the control circuit 106 selects the second set of configuration information when the detector circuit 104 reports otherwise. When the circuit 100 is implemented with a programmable logic device, the control circuit 106 may be implemented by a microprocessor component, or by a computer program that controls the operation of the microprocessor component.

The output circuit 108 receives an input audio signal and the selected configuration information. The output circuit 108 modifies the input audio signal according to the selected configuration information, and generates an output audio signal that corresponds to the input audio signal as modified according to the selected configuration information.

The input audio signal may be in the form of samples (e.g., two-channel 16-bit pulse coding modulation signal sampled at a 44.1 kHz rate per channel). In this case, the samples may have been previously processed by another device. For example, an MP3 processor (not shown) may convert MP3 data to generate the samples that are provided to the output circuit 108. The input audio signal may be itself further processed by the output circuit 108. For example, the output circuit 108 may include an MP3 decoder (not shown). The output circuit 108 may perform MP3 decoding of the input audio signal to generate samples that are then modified according to the selected configuration information. According to an embodiment, the environmental information may also change how the audio information is decoded. Many audio codecs (e.g., Dolby Digital® and Dolby Pulse®) have built in post-processing functionality: dynamic range compression and potentially equalization. Instead of having a separate and potentially expensive post-processing function, the environmental information may be used to modify the decoded audio in a way that makes it more acceptable for the current position and relationship of the device to the environment.

Figure 2:
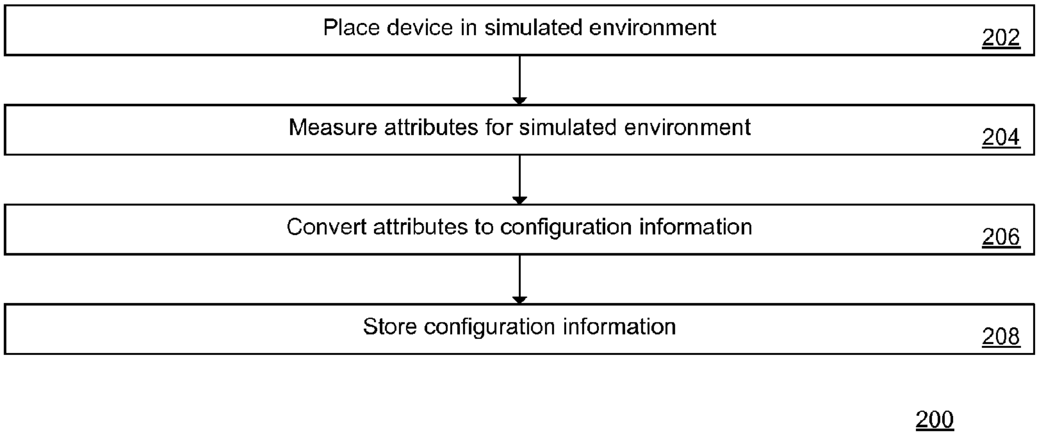
FIG. 2 is a simplified flow diagram of a method 200 of generating the various sets of configuration data, according to an embodiment of the present invention.

FIG. 2 is a simplified flow diagram of a method 200 of generating the various sets of configuration data, according to an embodiment of the present invention. The method 200 may be performed when the device that includes the circuit 100 is being designed, manufactured, assembled, configured, calibrated or tested. (For brevity, reference below will be made to the circuit 100 as well as the device that includes the circuit 100; the choice of wording is intended to be illustrative, not exclusory.)

In step 202, the circuit 100 is placed in a simulation of a standard reproduction environment. For example (continuing the above example), consider two environments. In the first environment, the television is attached to a stand on a table, 3 feet off the ground in a 10×10 room, and the stand mounted television is 2 feet out from a wall. In the second environment, the television is 3 feet off the ground in the 10×10 room, and is mounted on a wall. These environments may correspond to simulations of generic environmental situations in which the television is expected to operate. For example, the simulated environment may include some general assumptions regarding the properties of standard home walls and table furniture.

In step 204, the attributes for each environment are measured. This measurement may take place when the device is being designed, manufactured, assembled, configured, calibrated or tested. This may include outputting an audio test pattern (from the device) and measuring the effect of the environment on the test pattern. That is, it is recognized that the audio response of the device may vary (from the perspective of a listener) depending upon its location in the environment. For example (continuing the above example), the test pattern measured in the first environment results in a first set of attributes (resulting from the stand mounting on a table), and the test pattern measured in the second environment results in a second set of attributes (resulting from the wall mounting).

In step 206, the attributes measured in step 204 are converted to configuration information. The configuration information then indicates a desired modification to the audio output by the device such that a listener perceives the output audio in the same way (in a consistently perceived manner) regardless of the environment. For example, when the television includes backward-facing speakers, the configuration information will then indicate that the output should be modified so that a listener perceives the same sound regardless of the television being on the stand or on the wall.

In step 208, the sets of configuration information are stored in the circuit 100, for example in the memory circuit 102. An environment indicator may also be stored with the configuration information. For example (continuing the above example), the environment indicator of "0" may be associated with the first set of configuration information, and indicates that the first set of configuration information is associated with the stand mounting; the environment indicator of "1" may indicate that the second set of configuration information is associated with the wall mounting. The environmental indicator may include additional bits sufficient to uniquely identify a set from a number of sets.

According to an embodiment, the simple example environments discussed above may be expanded with more complex information. For example, the device may detect not only that it is mounted on a wall, but also uses a second sensor to detect the type of material the wall is made of (e.g., drywall, brick, plaster, stone, wood and the like); the device then compensates accordingly depending on the acoustic characteristics of the wall (or table; e.g., glass table, wood table, cloth table, etc.).

The process described above may be contrasted with existing systems, such as the AVRs described in the background above. The method 200 may be used to address the issue of a complete system (with built-in speakers) such as a television, sound bar or MP3 player dock. For such devices, some measurements may be made in the factory with the equipment in various standard positions. Correction equalization and processing presets can then be loaded into the system; the system may self-detect its position in the acoustic environment, and the correct preset can be recalled and applied. This negates the need for the user to do anything beyond installing or moving the device. Also by pre-analyzing the device at the factory, expensive measurement equipment such as a microphone do not need to be included with the device, thereby saving the manufacturer and consumer money. In summary, whereas the AVRs described in the background above are directed toward sensing the environment and configuring themselves based directly on that information, an embodiment of the present invention is directed toward sensing an attribute that is related to the environment (e.g., the location of the device with respect to a wall), and configuring the device based on the detected attribute (not on the environment directly). That is, an embodiment of the present invention does not configure itself based directly on the environment, only indirectly on the environment via another detected attribute.

Figure 3:
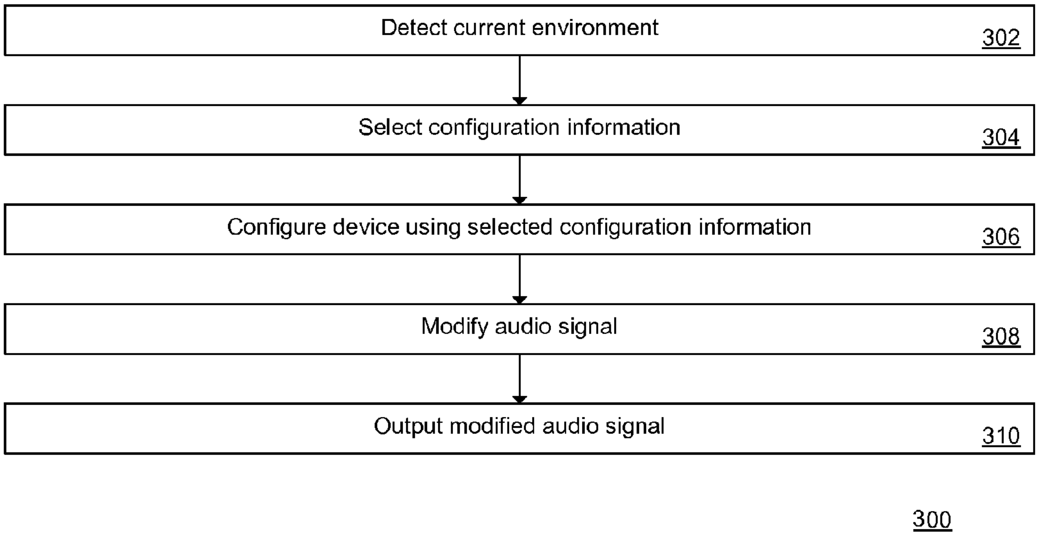
FIG. 3 is a simplified flow diagram of a method 300 of modifying an audio signal according to the environment where the device is, according to an embodiment of the present invention.

FIG. 3 is a simplified flow diagram of a method 300 of modifying an audio signal according to the environment where the device is located, according to an embodiment of the present invention. The method 300 may be performed by the circuit 100 during normal operation (e.g., the configuration information has already been stored in the circuit 100).

In step 302, the current environment is detected. The current environment refers to the environment that the device is currently in. (Although the term "environment" is used here, it is to be understood that the detection is a specific detection of an attribute of the environment, such as the location of the device, and not a general detection of all attributes of the environment.) The detector circuit 104 may perform step 302. For example (continuing the above example), the detector circuit 104 may detect a closed circuit when the television is mounted on the stand; this indicates that the "stand mounting" environment has been detected.

In step 304, an appropriate set of configuration information is selected according to the environment detected in step 302. The control circuit 106 may select the configuration information from the memory circuit 102 using the information detected by the detector circuit 104.

In step 306, the device is configured using the selected configuration information from step 304. The control circuit 106 may configure the output circuit 108 using the selected configuration information.

In step 308, the device modifies an audio signal according to the selected configuration information. The output circuit 108 may perform step 308.

In step 310, the device outputs the modified audio signal. The output circuit 108 may perform step 310.

In this manner, the device may generate an audio output appropriate for the current environment, without requiring intervention by a user.

Figure 4A:
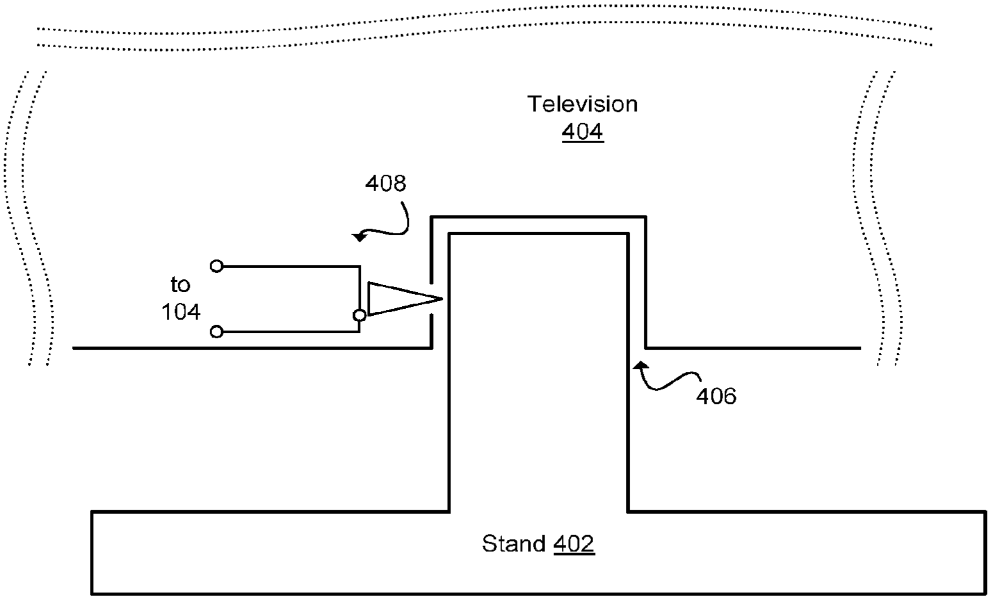
FIGS. 4A-4B are views of a television mounting embodiment of the present invention.
Figure 4B:
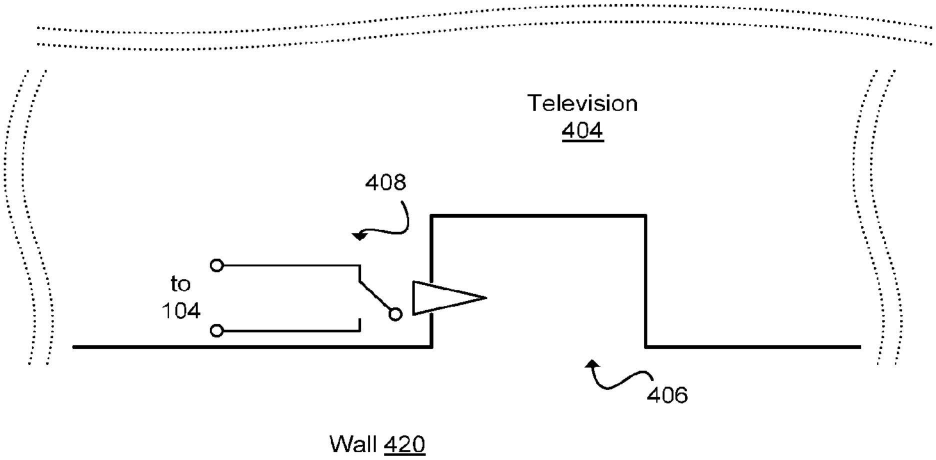

FIGS. 4A-4B are views of a television mounting embodiment of the present invention. FIG. 4A is a partial cross-sectional view and functional diagram illustrating a stand mounting, and FIG. 4B is a partial cross-sectional view and functional diagram illustrating a wall mounting.

FIG. 4A shows (partially) a stand 402 and a television 404. The television 404 is a flat panel television, either volatile (e.g., a plasma, liquid crystal, rear projection, organic light emitting diode, or electroluminescent display or the like) or static (e.g., an electrophoretic, cholesteric, or bichromal ball display or the like). In alternative embodiments, the television may use a cathode ray tube. The television 404 includes a cavity 406 for mounting the television 404 on the stand 402. The television 404 includes a switch 408 that flexibly protrudes into the cavity 406. According to an embodiment, the switch 408 includes a spring-loaded pogo pin. According to an embodiment, the switch 408 is mechanical. According to an embodiment, the switch 408 is electronic. According to an embodiment, the switch 408 is electromechanical.

The switch 408 is coupled to the detector circuit 104 (see FIG. 1). When the television 404 is mounted on the stand 402, the switch 408 flexes inward, closing a circuit. The detector circuit 104 detects the closed circuit. The circuit 100 uses this information to determine that the environment of the television 404 is "stand mounted", selects the corresponding configuration information, and configures the television 404 appropriately.

FIG. 4B shows (partially) the television 404 not on a stand (e.g., mounted on a wall 420). Without the stand 402 in the way, the switch 408 protrudes into the cavity 406, opening the circuit. The detector circuit 104 detects the open circuit. The circuit 100 uses this information to determine that the environment of the television 404 is "not stand mounted", selects the corresponding configuration information, and configures the television 404 appropriately.

Besides the switch 408, various other types of sensors may be used to detect the environment of the television 404. According to an embodiment, a sensor detects an electrical contact between the television 404 and an object in the environment. According to an embodiment, a sensor detects the light level of the environment that the television 404 is in. According to an embodiment, a light sensor detects whether an opening is obscured or not in order to infer that the television 404 has the stand attached; alternatively a light sensor on the back of the television 404 may detect the absence of light that corresponds to a wall mounting. According to an embodiment, a sensor detects the temperature of the environment that the television 404 is in. According to an embodiment, a sensor detects the weight of an object in the environment on the television 404. According to an embodiment, a sensor detects the pressure of an object in the environment on the television 404. According to an embodiment, a sensor detects the motion of an object in the environment relative to the television 404. According to an embodiment, a sensor detects the vibration of an object in the environment of the television 404. According to an embodiment, a sensor detects the electro-magnetic field of the environment of the television 404. According to an embodiment, a sensor detects that the television 404 is outdoors or indoors, and adjusts the output accordingly.

According to an embodiment, the switch 408 may detect when a back mounting is coupled to the television 404 (for mounting on the wall). In this embodiment, for example, the closed circuit of the switch indicates a wall mounting environment (instead of the stand mounting environment).

Another type of sensor that may be used according to an embodiment is a transducer coupled to a speaker (or a speaker being used as a microphone sensing element) of the television 404. This speaker then acts as a microphone to detect the effect of the environment on the output of another speaker of the television 404. For example, when the television 404 is mounted on the wall, the sensor detects the sound reflection resulting from the environment, and the circuit 100 uses this information to configure the television 404.

According to an embodiment, an infrared (or a laser) detector may be used to determine the distance from the television to a wall, a ceiling, a floor, or a table top. According to a further embodiment, diffraction of the light may be sensed in order to determine the surface texture (of the wall, for example), and the device may be configured based on the texture.

Device, Sensor and Environment Details and Examples

Besides the device that includes the circuit 100 being a television (see FIGS. 4A-4B), other types of devices may include the circuit 100. For illustrative purposes, a number of devices are discussed below. For each device, for illustrative purposes, various configuration options (for various environments) are discussed.

A sound bar may include the circuit 100 according to an embodiment of the present invention. A sound bar is an amplified speaker system that may be coupled to a television or other audio reproduction device such as a portable music player. Sound bars are often used to provide an additional or improved audio reproduction experience available via the connected reproduction device. The sound bar is often is placed below or underneath the television (e.g., on the table or connected to the wall) when the television is mounted on a stand or on the wall. The types of sensors and environments are similar to those discussed above regarding FIGS. 4A-4B (e.g., electrical contact, light level, sound reflection, etc.). Note that the sound bar often lacks a display or other user interface component, so automatically configuring the sound bar based on the environment, without user input, is a feature of the circuit 100.

A cellular telephone may include the circuit 100 according to an embodiment of the present invention. According to an embodiment, an accelerometer in the telephone may be sensed to detect whether the telephone is in landscape orientation or portrait orientation, and the circuit 100 may adjust the output accordingly; for example, this may modify the configuration of a virtualizer which needs to know the general position and configuration of speakers in relation to a user's ears. As another example, the position information may adjust the balance and fade configuration; still further, the left speaker could become the "right speaker" after 180 degree rotation. According to an embodiment, the accelerometer may be sensed to detect that the user has moved the telephone from the "at the ear" position to the "held in hand" position or vice versa, and the circuit 100 may adjust the output accordingly; for example, the volume may be increased when the telephone is in the "held in hand" position. According to an embodiment, an electrical contact may be sensed to detect whether the telephone is docked to a cradle or held in the hand; for example, the volume may be increased when the device is docked. According to an embodiment, a global positioning system (GPS) circuit in the telephone may be used to detect the location of the telephone, and the circuit 100 may adjust the output accordingly; for example, when the telephone is moving (e.g., in a vehicle), the telephone may output information as a speakerphone to facilitate hands-free operation. The GPS circuit may also be used for other modifications, for example, configuring a speech recognition system to select an input language according to the detected region of the world (e.g., German in Germany), or a translation system to select an output language according to the detected region.

A docking station may include the circuit 100 according to an embodiment of the present invention. A docking station generally refers to a speaker to which another device (such as a portable media device, e.g. MP3 player) connects for enhanced audio output. The types of sensors and environments are similar to those discussed above regarding the sound bar.

A portable radio (e.g., a boom box) may include the circuit 100 according to an embodiment of the present invention. The types of sensors and environments are similar to those discussed above regarding the sound bar.

An automobile may include the circuit 100 according to an embodiment of the present invention. A variety of environments and sensors are related to the automobile embodiment. For example, for a convertible, the top may be up or down; this environment may be sensed via a communication with the convertible top controller, via an electrical contact, via a physical switch, via a microphone (detecting wind noise), etc. As another example, a window may be up or down; this environment may be sensed via a communication with the window controller, via an electrical contact, via a physical switch, via a microphone, etc. As another example, the windshield wiper activity may be detected; this environment may be sensed via a communication with the wiper controller, via an electrical contact, via a physical switch, via a microphone, etc. As another example, the speed of the automobile may be detected; this environment may be sensed via a communication with the speedometer controller, via a communication with a GPS device, via an electrical contact, via a mechanical switch, via a microphone, etc. As another example, the number and position of passengers may be detected; this environment may be sensed via a communication with an airbag sensor, via a communication with a seatbelt sensor, via an electrical contact to a pressure sensor in a seat, via a mechanical contact with the seatbelt buckle, etc.

Configuration Information Details and Examples

According to an embodiment of the present invention, the configuration information can modify the output of the device in a variety of ways. For illustrative purposes, a number of specific types of configuration information are discussed below, as well as examples of devices that may be configured with that type of configuration information.

The frequency response of the speaker(s) or other reproduction transducer of the device may be adjusted with the configuration information according to an embodiment of the present invention. The frequency response refers to increasing or decreasing the signal level according to frequency bands of the audio signal. For example, the reproduced frequency response of a device and its built-in speakers may differ dramatically depending on the physical location of the device. According to an embodiment, a configurable correcting filter makes the frequency response of the low quality TV and sound bar speakers more flat. The flatness of the spectrum depends upon location, so the filtering is to compensate for non-ideal device components and their location and improve the quality of the reproduced audio.

The volume of the device may be adjusted with the configuration information according to an embodiment of the present invention. As another example, a mobile telephone has a dual mode speaker for ear operation or for speakerphone operation. The volume may be adjusted automatically depending on the position of the device (hand held or up against the ear). In addition, the dynamic range processing may be adjusted according to position. For example, increasing the dynamic range compression of the phone playback in speakerphone mode may improve intelligibility in a noisy environment, and less compression may be used when the device is up against the ear.

The balance of the device may be adjusted with the configuration information according to an embodiment of the present invention. The balance refers to the relative signal strength between two speakers, for example left and right (or front and rear). For example, when the automobile windows are down on the left side, the balance of the left speaker may be increased. For example, a television or sound bar may have a wall or object closer to one speaker in relationship to the other, which may benefit from a change in speaker balance.

The surround sound attributes of the device may be adjusted with the configuration information according to an embodiment of the present invention. For example, some devices and surround reproduction techniques may benefit from knowing that a surface that is acoustically reflective is near the device; this reflection may be used to create advanced virtualization or surround effects. For example, if a television detects that it is mounted to a wall and that a ceiling is 2 feet above it, the television may automatically enable and configure a reproduction component that bounces audio off of the ceiling into the room.

The inverse filtering optimization parameters of the device may be adjusted with the configuration information according to an embodiment of the present invention. The inverse filtering optimization parameters generally include filter coefficients used for equalization. These can be static (fixed) equalization parameters or dynamic (time and level varying) equalization parameters whose constants depend on location. For example, level and time variations of the filtering may depend on the location of the device in the environment.

Implementation Details

An embodiment of the invention may be implemented in hardware, executable modules stored on a computer readable medium, or a combination of both (e.g., programmable logic arrays). Unless otherwise specified, the steps included as part of the invention need not inherently be related to any particular computer or other apparatus, although they may be in certain embodiments. In particular, various general-purpose machines may be used with programs written in accordance with the teachings herein, or it may be more convenient to construct more specialized apparatus (e.g., integrated circuits) to perform the required method steps. Thus, the invention may be implemented in one or more computer programs executing on one or more programmable computer systems each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein. (Software per se and intangible signals are excluded to the extent that they are unpatentable subject matter.)

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

The invention claimed is:

1. An apparatus including a circuit for automatically adjusting an output of an audio device, the circuit comprising:

a memory circuit that is configured to store configuration information, wherein the configuration information includes one of balance information and surround sound information;

a detector circuit that is configured to detect environment information related to an environment in which the apparatus is present;

a control circuit that is configured to select selected configuration information from the memory circuit according to the environment information detected by the detector circuit; and an output circuit that is configured to receive an input audio signal and the selected configuration information, that is configured to modify the input audio signal according to the selected configuration information, and is configured to generate an output audio signal corresponding to the input audio signal as modified according to the selected configuration information.

2. The apparatus of claim 1, wherein the configuration information includes a first set of configuration information corresponding to a first environment and a second set of configuration information corresponding to a second environment.

3. The apparatus of claim 1, wherein the configuration information includes a first set of configuration information corresponding to a wall mounting of the apparatus, and a second set of configuration information corresponding to a stand mounting of the apparatus.

4. The apparatus of claim 1, wherein the configuration information includes one of frequency response information, signal level information, and volume information.

5. The apparatus of claim 1, further comprising one of a television, a sound bar, and a docking station.

6. The apparatus of claim 1, wherein the detector circuit selectively detects a closed circuit corresponding to a stand mounting environment and an open circuit corresponding to a wall mounting environment.

7. The apparatus of claim 1, wherein the detector circuit is coupled to one of a mechanical switch, an electrical switch, and an electromechanical switch.

8. The apparatus of claim 1, wherein the detector circuit is coupled to one of a velocity sensor and an accelerometer.

9. The apparatus of claim 1, wherein the detector circuit is coupled to a microphone.

10. The apparatus of claim 1, wherein the detector circuit is coupled to a global positioning system device.

11. The apparatus of claim 1, wherein the control circuit selects a first set of configuration information when the detector circuit detects first environment information related to a first environment, and selects a second set of configuration information when the detector circuit detects second environment information related to a second environment.

12. The apparatus of claim 1, wherein the control circuit is configured to program the output circuit with the selected configuration information.

13. The apparatus of claim 1, wherein the output circuit is configured to modify the input audio signal in a first way when the detector circuit detects first environment information related to a first environment, and is configured to modify the input audio signal in a second way when the detector circuit detects second environment information related to a second environment.

14. The apparatus of claim 1, wherein the detector circuit detects an attribute of the environment as the environment information, and wherein the control circuit selects the selected configuration information based indirectly on the environment.

15. The apparatus of claim 1, wherein the configuration information corresponds to a plurality of simulated environments.

16. The apparatus of claim 1, wherein the configuration information corresponds to a plurality of simulated environments, and wherein the environment information corresponds to one of the plurality of simulated environments.

17. A system for automatically adjusting an audio output, comprising:

a device that generates the audio output;

a memory circuit that is configured to store configuration information, wherein the configuration information includes one of balance information and surround sound information;

a detector circuit that is configured to detect environment information related to an environment in which the device is present;

a control circuit that is configured to select selected configuration information from the memory circuit according to the environment information detected by the detector circuit; and an output circuit that is configured to receive an input audio signal from the device and the selected configuration information, that is configured to modify the input audio signal according to the selected configuration information, and is configured to generate an output audio signal corresponding to the input audio signal as modified according to the selected configuration information, wherein the device outputs the output audio signal as the audio output.

18. The system of claim 17, wherein the output circuit is configured to modify the input audio signal in a first way when the detector circuit detects first environment information related to a first environment, and is configured to modify the input audio signal in a second way when the detector circuit detects second environment information related to a second environment.

19. A method of automatically adjusting an output of an audio device, comprising:

storing configuration information, wherein the configuration information includes one of balance information and surround sound information;

detecting environment information related to an environment in which the audio device is present;

selecting selected configuration information of the configuration information according to the environment information having been detected;

receiving an input audio signal;

modifying the input audio signal according to the selected configuration information; and generating an output audio signal corresponding to the input audio signal as modified according to the selected configuration information.

20. The method of claim 19, further comprising:

simulating a plurality of environments;

measuring a plurality of attributes of the plurality of environments; and generating the configuration information according to the plurality of attributes.

* * * * *